US008409885B2

(12) United States Patent
Chan et al.

(10) Patent No.: US 8,409,885 B2
(45) Date of Patent: Apr. 2, 2013

(54) METHOD FOR PACKAGING LIGHT EMITTING DIODE

(75) Inventors: Shiun-Wei Chan, Hsinchu (TW); Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 111 days.

(21) Appl. No.: 13/191,469

(22) Filed: Jul. 27, 2011

(65) Prior Publication Data
US 2012/0107975 A1    May 3, 2012

(30) Foreign Application Priority Data

Oct. 29, 2010    (CN) .......................... 2010 1 0524074

(51) Int. Cl.
*H01L 21/00*    (2006.01)
*H01L 23/02*    (2006.01)
*H01L 21/56*    (2006.01)

(52) U.S. Cl. ................ 438/26; 438/15; 438/27; 438/51; 438/64; 438/106; 257/678; 264/272.15; 264/272.17

(58) Field of Classification Search .................. 438/26, 438/27, 15, 51, 64, 106; 257/678, 688–697; 264/272.11–272.17
See application file for complete search history.

(56) References Cited

U.S. PATENT DOCUMENTS

| 6,013,947 | A  | * | 1/2000 | Lim ............................. 257/685 |
| 6,338,813 | B1 | * | 1/2002 | Hsu et al. .................. 264/272.14 |
| 6,344,162 | B1 | * | 2/2002 | Miyajima ................. 264/272.14 |
| 2008/0160658 | A1 | * | 7/2008 | Wang et al. ..................... 438/28 |

* cited by examiner

*Primary Examiner* — Fernando L Toledo
*Assistant Examiner* — Karen Kusumakar
(74) *Attorney, Agent, or Firm* — Altis Law Group, Inc.

(57) ABSTRACT

An LED packaging method includes: providing a mold with two isolated receiving spaces and a substrate with a die supporting portion and an electrode portion respectively received in the two receiving spaces; disposing an LED die on the die supporting portion and electrically connecting the LED die to the electrode portion of the substrate by metal wires; injecting a light wavelength converting material into the first receiving space and covering the LED die with the light wavelength converting material; communicating the first receiving space to the second receiving space, injecting a first light transmissive material into the communicated first and second spaces, and covering the light wavelength converting material and the metal wires with the first light transmissive material; and removing the mold to obtain a packaged LED.

12 Claims, 23 Drawing Sheets

Providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space, fixing the die supporting portion and electrode portion respectively to bottoms of the first and second receiving spaces by solder

↓

Disposing an LED die on the die supporting portion of the substrate and electrically connecting the LED die to the electrode portion of the substrate by metal wires

↓

Injecting a light wavelength converting material into the first receiving space and covering the LED die with the light wavelength converting material

↓

Communicating the first receiving space to the second receiving space, injecting a first light transmissive material into the communicated first and second spaces, and covering the light wavelength converting material, and the metal wires with the first light tranmissive material

↓

Heating the solder and removing the mold when the solder melts

FIG. 12

Providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space

↓

Disposing an LED die on the die supporting portion of the substrate and electrically connecting the LED die to the electrode portion of the substrate by metal wires

↓

Injecting a light wavelength converting material into the first receiving space and covering the LED die with the light wavelength converting material

↓

Injecting a second light transmissive material into the second receiving space and covering the electrode portion of the substrate with the second light transmissive material

↓

Communicating the first receiving space to the second receiving space, injecting a first light transmissive material into the communicated first and second spaces, and covering the light wavelength converting material, the second light transmissive material and the metal wires with the first light tranmissive material

↓

Removing the mold

FIG. 13A

Providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space, fixing the die supporting portion and electrode portion respectively to bottoms of the first and second receiving spaces by solder

↓

Disposing an LED die on the die supporting portion of the substrate and electrically connecting the LED die to the electrode portion of the substrate by metal wires

↓

Injecting a light wavelength converting material into the first receiving space and covering the LED die with the light wavelength converting material

↓

Injecting a second light transmissive material into the second receiving space and covering the electrode portion of the substrate with the second light transmissive material

↓

Communicating the first receiving space to the second receiving space, injecting a first light transmissive material into the communicated first and second spaces, and covering the light wavelength converting material, the second light transmissive material and the metal wires with the first light transmissive material

↓

Heating the solder and removing the mold when the solder melts

FIG. 14

METHOD FOR PACKAGING LIGHT EMITTING DIODE

BACKGROUND

1. Technical Field

The present disclosure generally relates to a method for packaging a light emitting diode (LED).

2. Description of Related Art

Generally, an LED package includes a substrate, an LED die arranged on the substrate, and an encapsulation formed on the substrate to cover the LED die. During a packaging process of the LED package, the LED die is wire bonded to electrical structures on the substrate by wires firstly, and then is covered by the encapsulation which is usually applied to the LED die and the wires by a compression molding. However, an undesired large compressing force may be exerted to the wires during the compression molding process, which leads to a poor reliability of the wire bonding connections in the LED package.

Therefore, it is necessary to provide an LED packaging method to overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

FIG. 12 is a flow chart of an LED packaging method in accordance with a second embodiment of the present disclosure.

FIG. 13A is a flow chart of an LED packaging method in accordance with a third embodiment of the present disclosure.

FIG. 14 is a flow chart of an LED packaging method in accordance with a fourth embodiment of the present disclosure.

DETAILED DESCRIPTION

Reference will now be made to the drawings to describe the present LED packaging method in detail.

Figure 1:
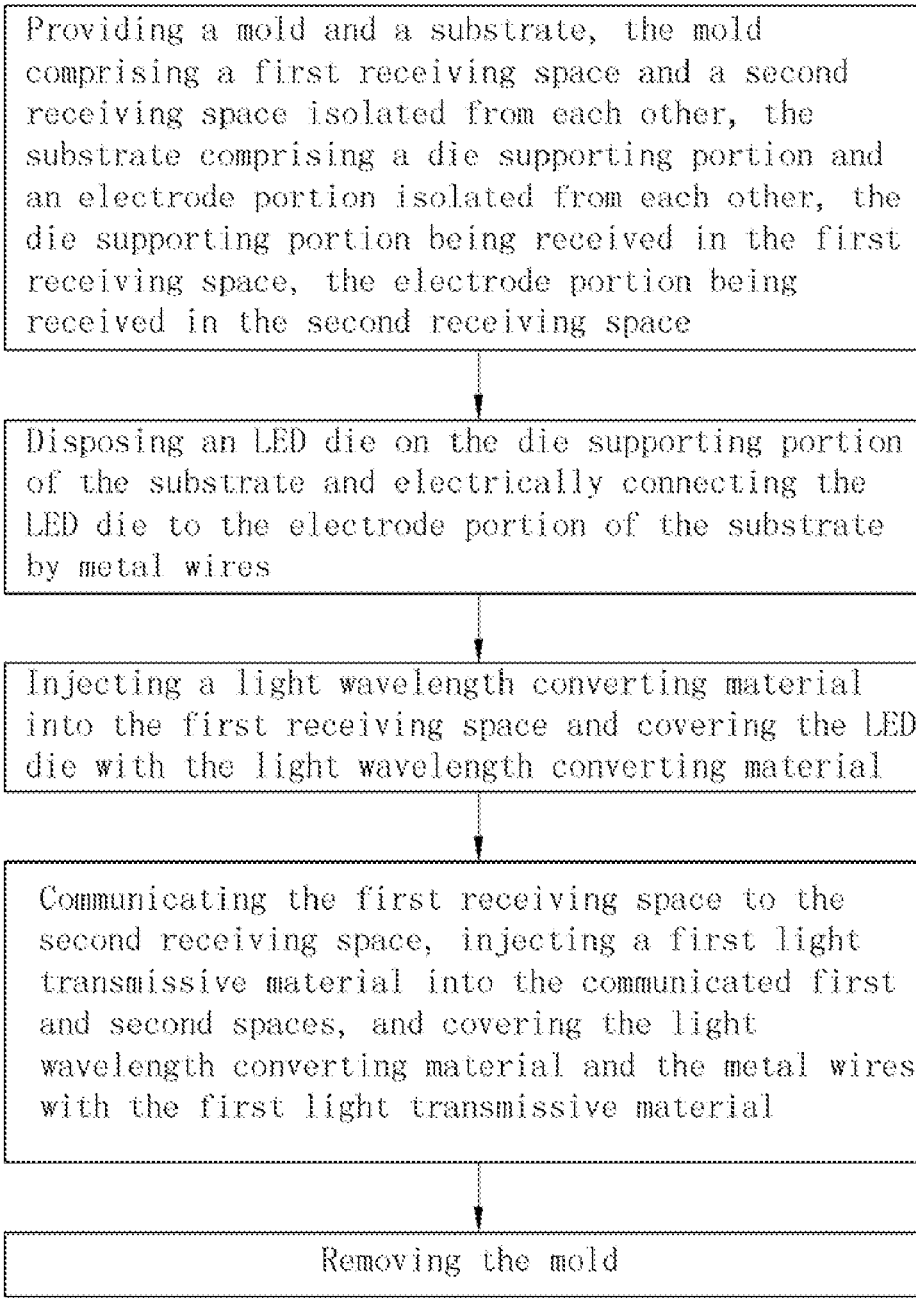
FIG. 1 is a flow chart of an LED packaging method in accordance with a first embodiment of the present disclosure.

Referring to FIG. 1, an LED packaging method according to a first embodiment includes:

step (a): providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space;

step (b): disposing an LED die on the die supporting portion of the substrate and electrically connecting the LED die to the electrode portion of the substrate by metal wires;

step (c): injecting a light wavelength converting material into the first receiving space and covering the LED die with the light wavelength converting material;

step (d): communicating the first receiving space to the second receiving space, injecting a first light transmissive material into the communicated first and second spaces, and covering the light wavelength converting material and the metal wires with the first light transmissive material; and step (e): removing the mold.

Figure 2:
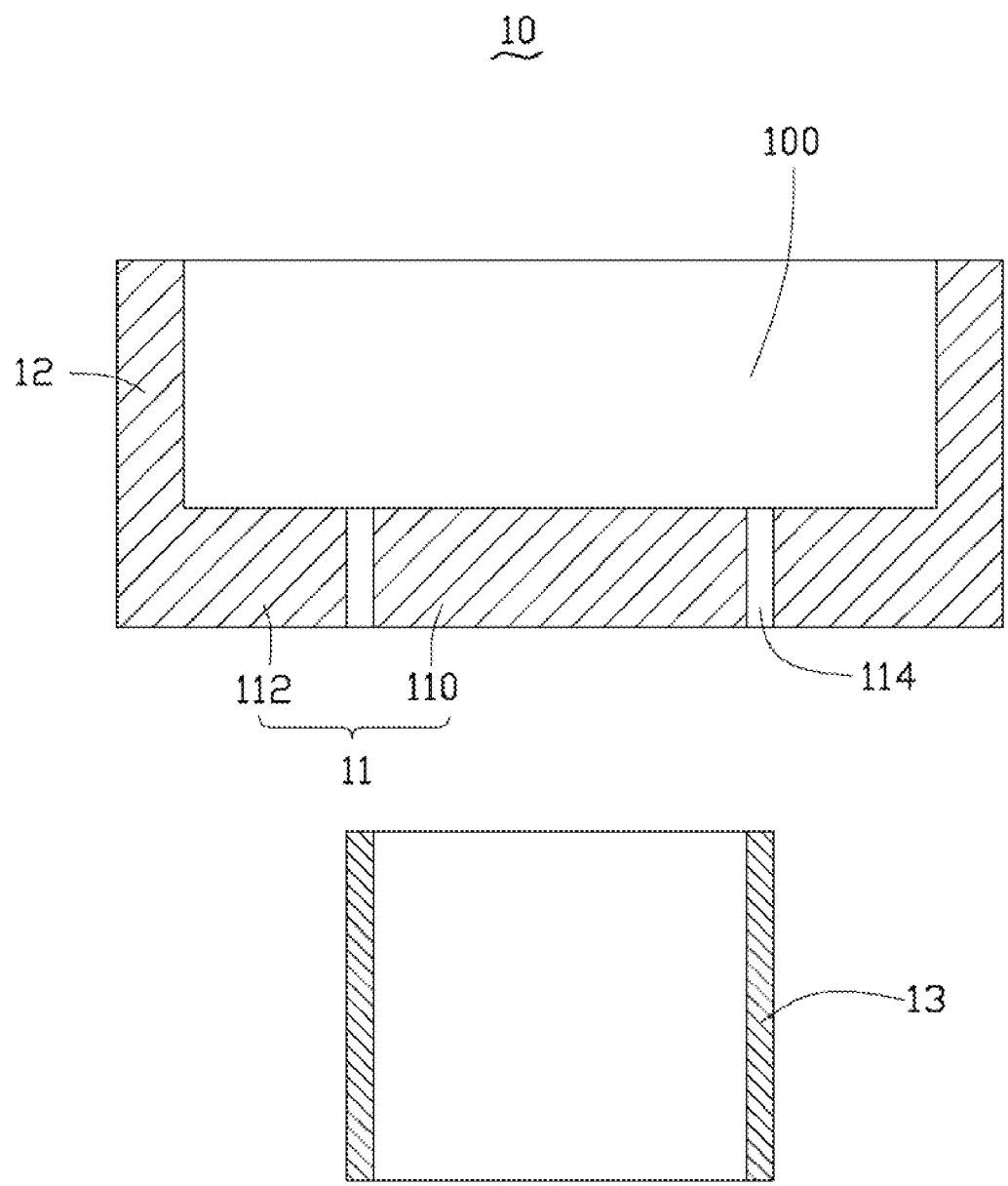
FIG. 2 is an exploded, cross-sectional view of a mold for practicing the method in accordance with the first embodiment of the present disclosure.
Figure 3:
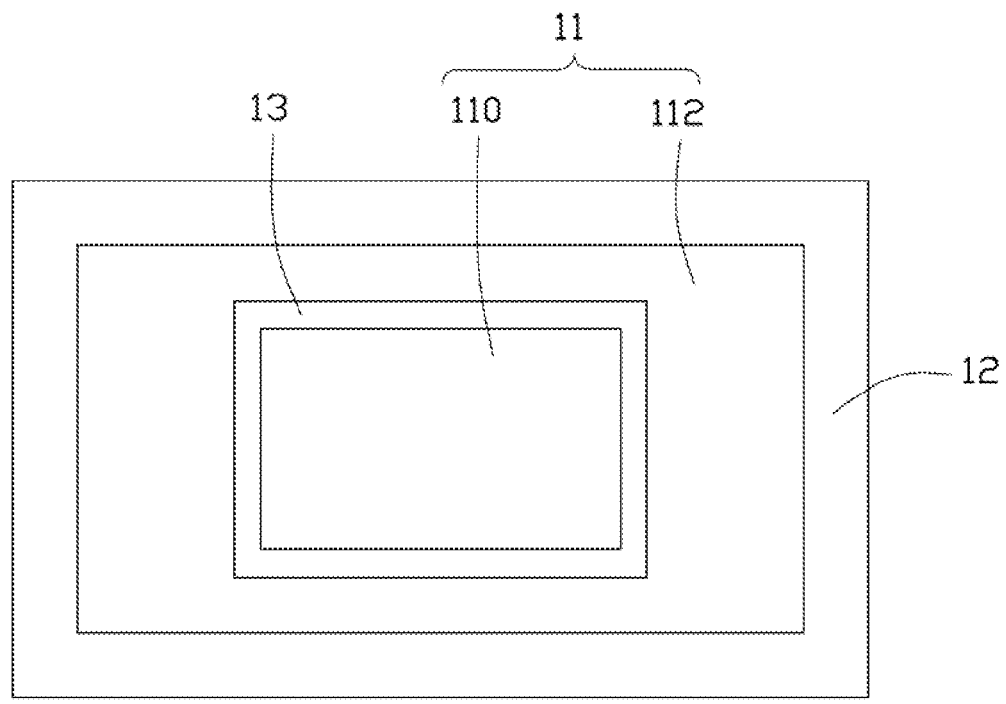
FIG. 3 is an assembled, top view of the mold of FIG. 2.

Referring to FIG. 2 and FIG. 3, the mold 10 provided in step (a) includes a bottom plate 11, a fence plate 12 and a baffle plate 13.

The bottom plate 11 further includes a first portion 110, a second portion 112 and a through hole 114. The second portion 112 has a shape of a rectangular ring and surrounds the first portion 110. The through hole 114 has a shape of a rectangular ring and is defined between the first portion 110 and the second portion 112, thereby isolating the first portion 110 from the second portion 112. The bottom plate 11 as shown in this embodiment of FIG. 2 is a rectangular, planar plate. Nevertheless, it can be other shapes, for example, circular or elliptic. The bottom plate 11 has a size slightly bigger than that of an LED die.

The fence plate 12 extends from peripheral sides of the second portion 112 of the bottom plate 11. The fence plate 12 and the bottom plate 11 cooperatively define a receiving chamber 100.

Figure 4:
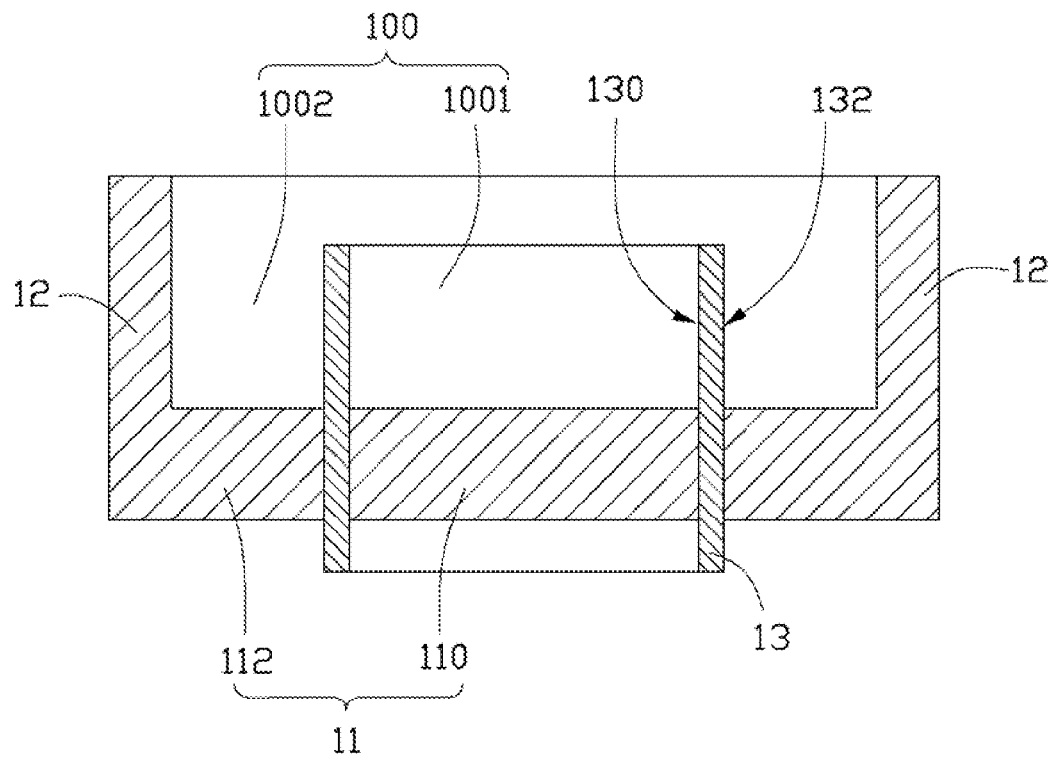
FIG. 4 is an assembled, cross-sectional view of the mold of FIG. 2.

The baffle plate 13 is a hollow column with a shape of a rectangular ring and has a size substantially the same as that of the through hole 114. The baffle plate 13 has a size equal to or slight smaller than that of the through hole 114. As such, referring to FIG. 4, one end of the baffle plate 13 penetrates through the through hole 114 and extends into the receiving chamber 100. The first portion 110 of the bottom plate 11 and the inner side surface 130 of the baffle plate 13 cooperatively define a first receiving space 1001. The second portion 112 of the bottom plate 11 and the outer side surface 132 of the baffle plate 13 cooperatively define a second receiving space 1002. As such, the receiving chamber 100 is divided into the first receiving space 1001 and the second receiving space 1002. The first receiving space 1001 and the second receiving space 1002 are isolated from each other by the baffle plate 13.

Figure 5:
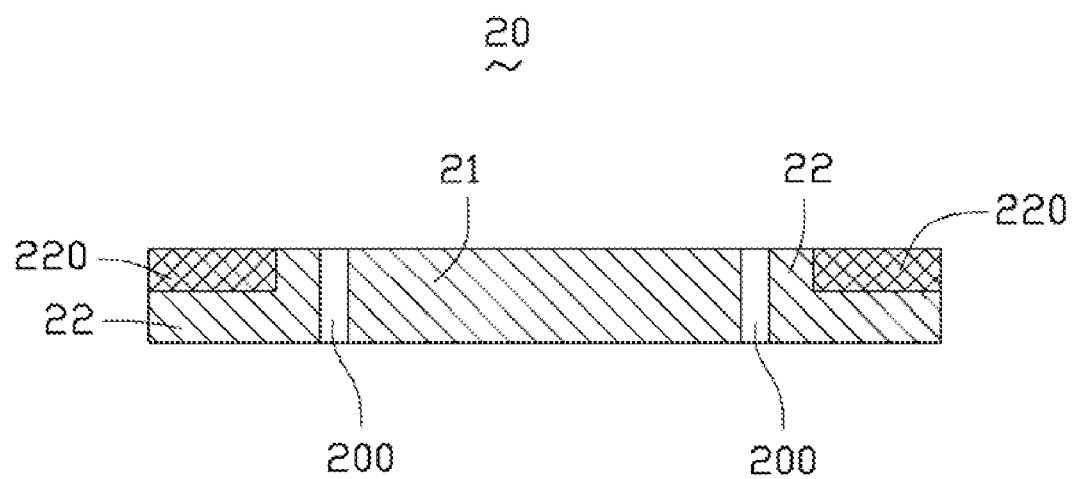
FIG. 5 is a cross-sectional view of a substrate for use in the method in accordance with the first embodiment of the present disclosure.

Referring to FIG. 5, the substrate 20 provided in step (a) includes a die supporting portion 21 and an electrode portion 22.

The die supporting portion 21 is configured for supporting an LED die to be encapsulated. As such, the die supporting portion 21 has a size equal to or larger than that of the LED die.

The electrode portion 22 surrounds the die supporting portion 21. The electrode portion 22 includes a pair of electrodes 220. The electrodes 220 are configured for transferring power to the LED die from an external power supply.

Between the die supporting portion 21 and the electrode portion 22, a rectangular, ring-shaped through hole 200 is formed. The through hole 200 isolates the die supporting portion 21 from the electrode portion 22. The shape of the through hole 200 is the same as that of the through hole 114. The through hole 200 has a size equal to that of the through hole 114.

Figure 6:
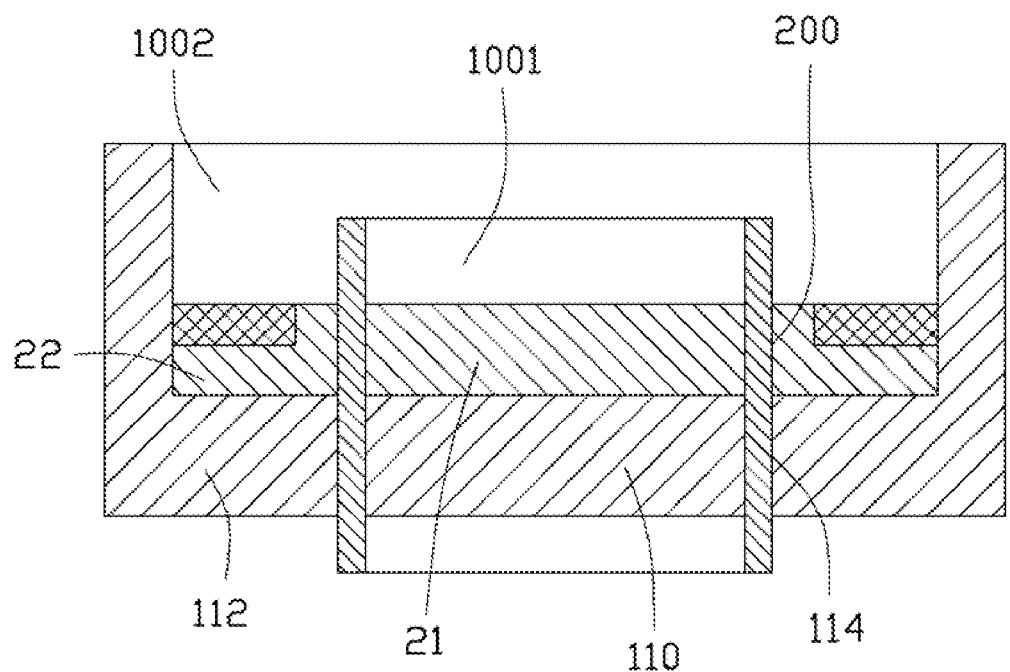
FIG. 6 is a cross-sectional view showing the substrate of FIG. 5 located in the mold of FIG. 3.

Referring to FIG. 6, when assembling the substrate 20 into the mold 10, the die supporting portion 21 is received in the first receiving space 1001 and contacts the first portion 110 of the bottom plate 11, the electrode portion 22 is received in the second receiving space 1002 and contacts the second portion 112 of the bottom plate 11, the through hole 200 is aligned and communicated with the through hole 114, the baffle plate 13 fittingly penetrates through the through holes 114, 200 successively into the receiving chamber 100.

Figure 7:
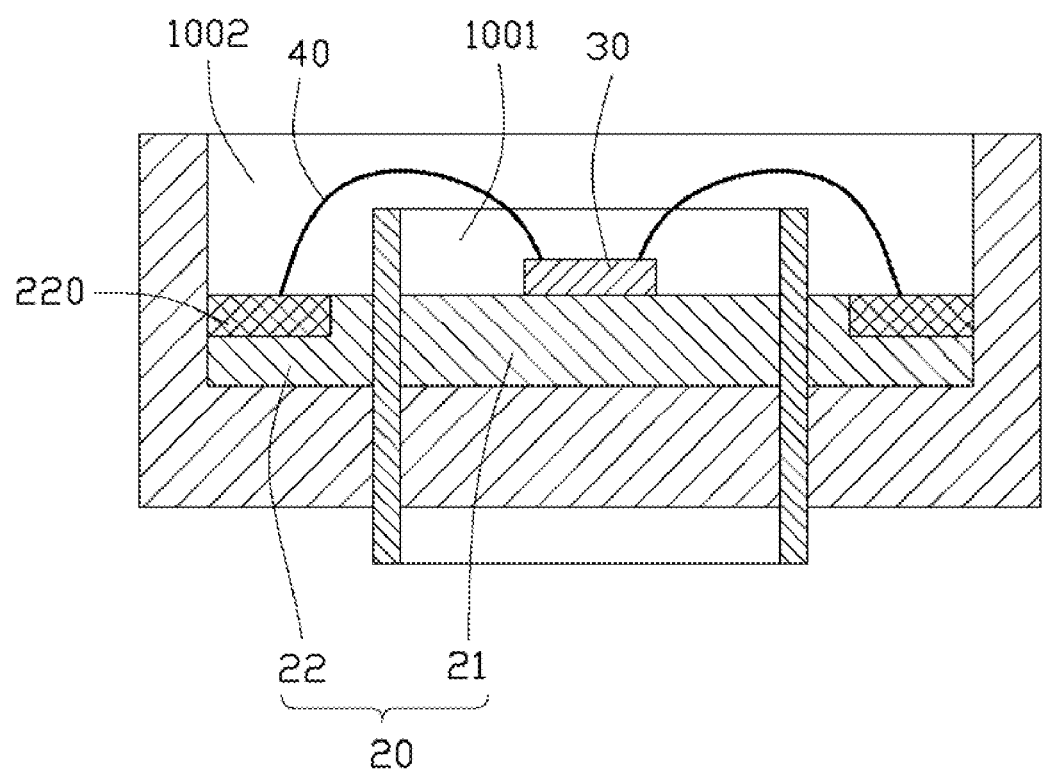
FIG. 7 is a cross-sectional view showing an LED die located on the substrate in FIG. 6.

Referring to FIG. 7, in step (b), the LED die 30 is electrically connected to the pair of electrodes 220 by metal wires 40. In this embodiment, the metal wires 40 are made of gold.

Figure 8:
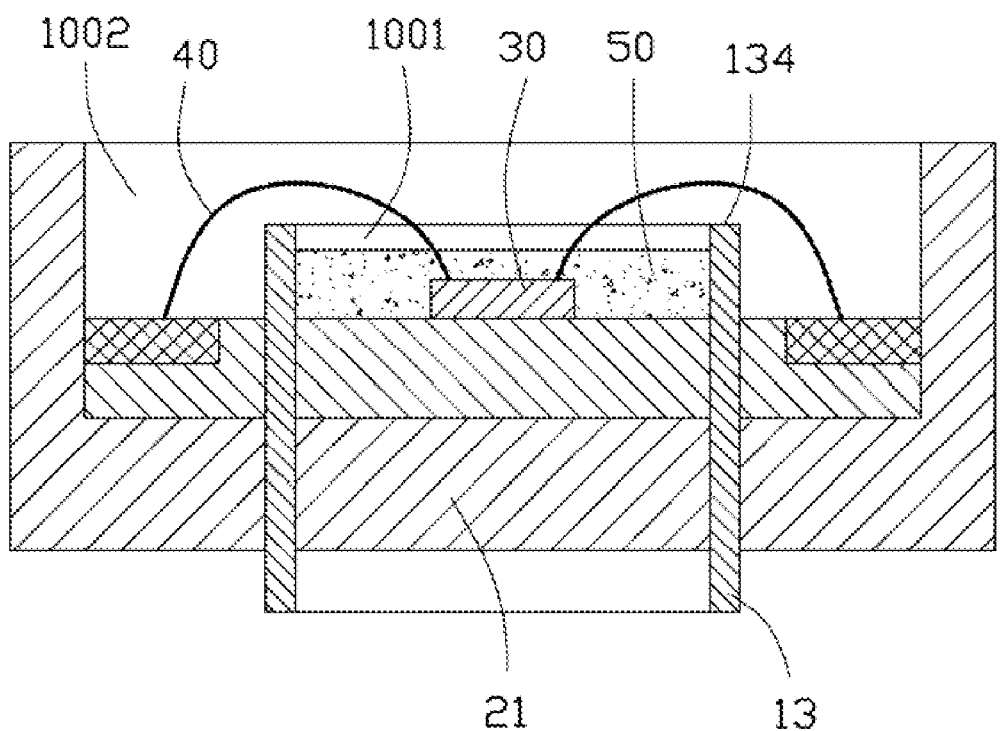
FIG. 8 is a cross-sectional view showing a light wavelength converting material injected into a first receiving space of the mold.

Referring to FIG. 8, in step (c), the light wavelength converting material 50 is injected into the first receiving space 1001 in a liquid state and solidified subsequently. The solidified light wavelength converting material 50 is formed to cover the bonds of the metal wires 40 and the LED die 30, thereby enhancing the bonding strength therebetween. In this embodiment, the light wavelength converting material 50 is fluorescent material.

It is to be said that, before filling the first receiving space 1001 with the light wavelength converting material 50, a distance between a top portion 134 of the baffle plate 13 and the die supporting portion 21 can be adjusted according to actual requirement to achieve a precise predetermined thickness of the light wavelength converting material 50 injected over the LED die 30.

In another aspect, a reserved space can be remained in the first receiving space 1001 during the injection of the wavelength converting material 50, thereby avoiding an overflowing of the wavelength converting material 50.

Figure 9:
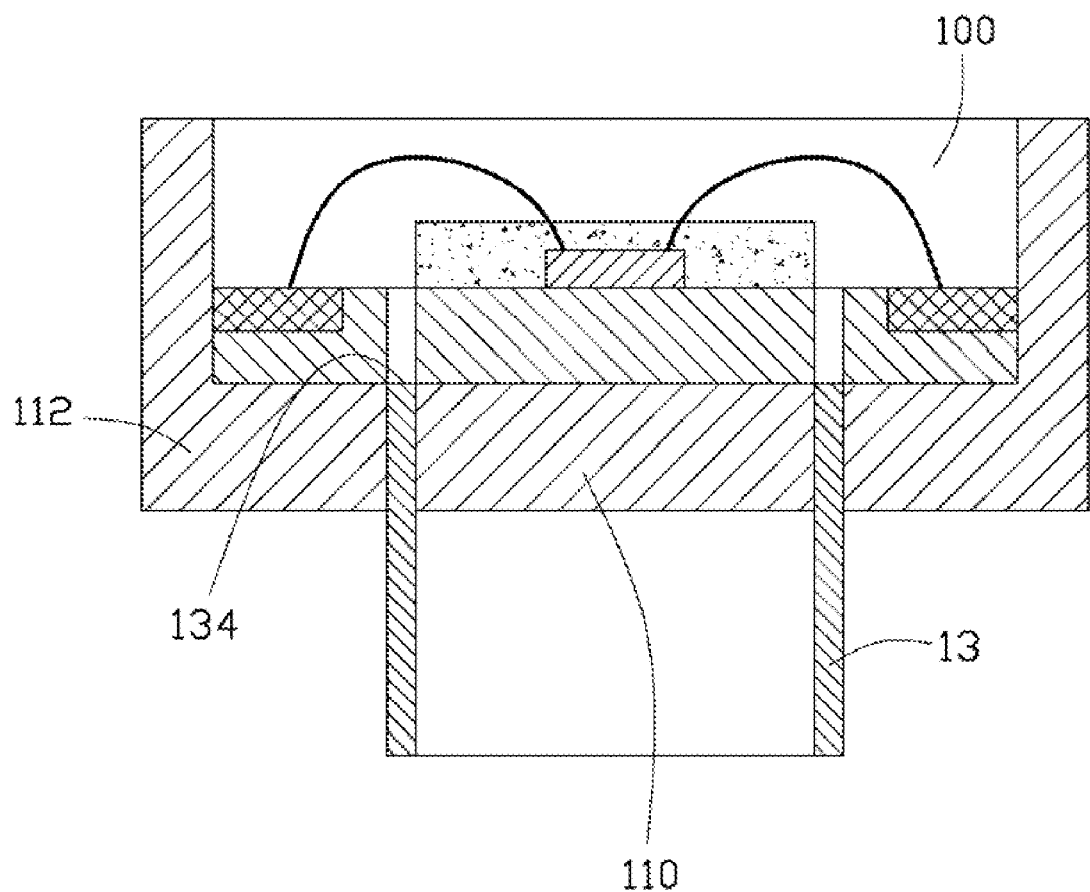
FIG. 9 is a cross-sectional view showing a baffle plate pulled out from the mold.
Figure 10:
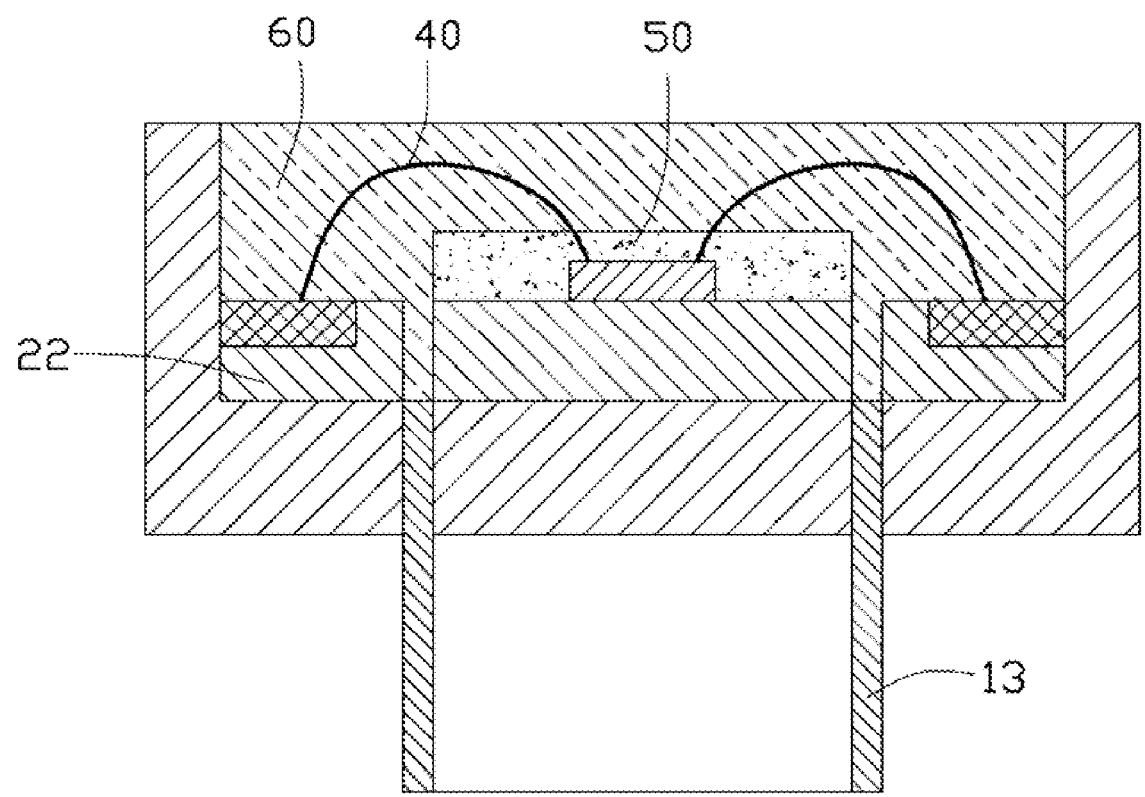
FIG. 10 is a cross-sectional view showing a light transmissive material injected into communicated first and second receiving spaces of the mold.
Figure 11:
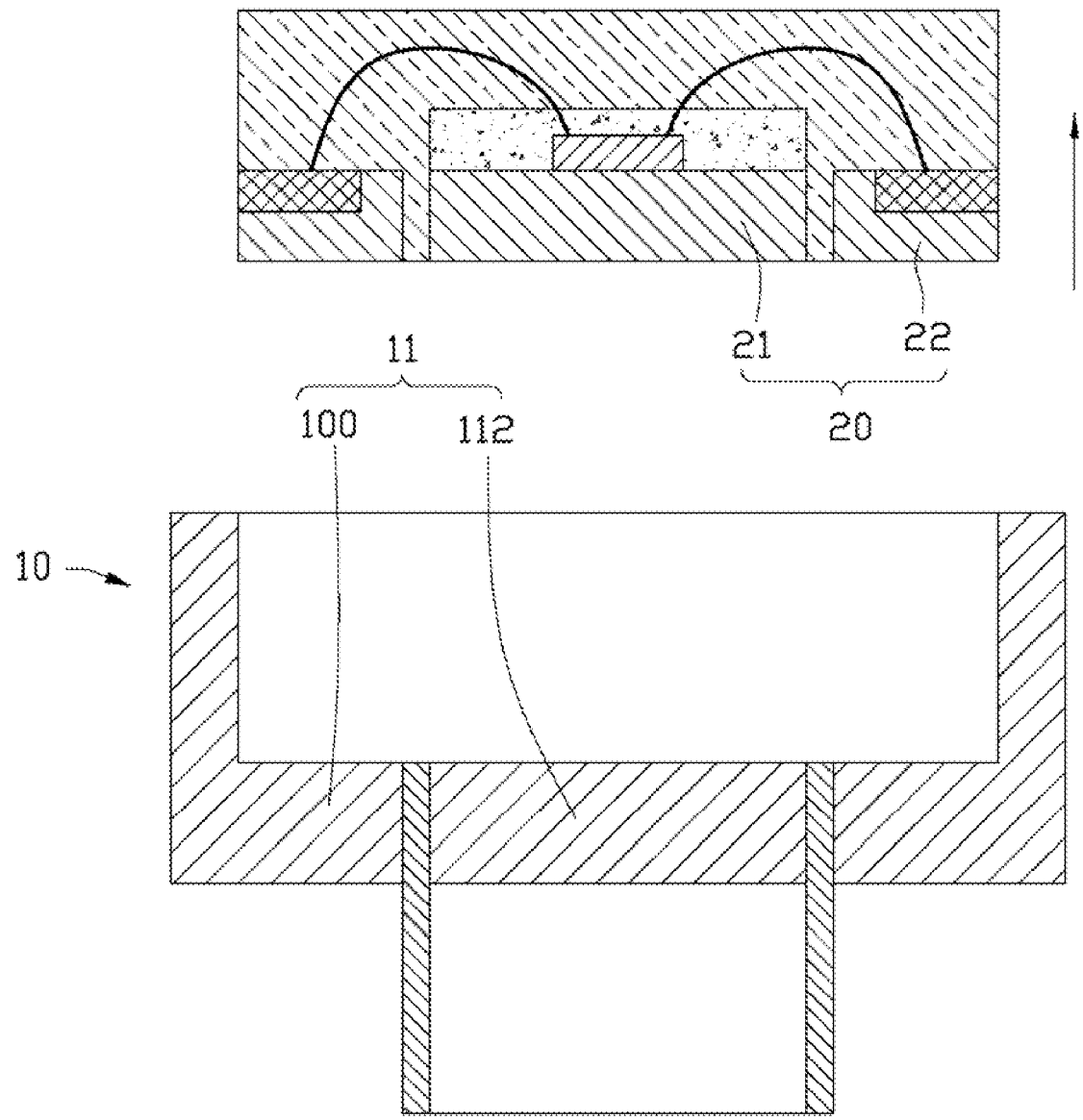
FIG. 11 is a cross-sectional view showing the mold removed from the substrate.

Referring to FIG. 9 and FIG. 10, in step (d), the first receiving space 1001 is communicated with the second receiving space 1002 by pulling the baffle plate 13 outwardly away from the receiving chamber 100. In this embodiment, the baffle plate 13 is pulled out to a position in which the top portion 134 of the baffle plate 13 is coplanar with top surfaces of the first portion 110 and the second portion 112 of the bottom plate 11. As such, the reserved space of the first receiving space 1001 unfilled by the wavelength converting material 50 is communicated with the second receiving space 1002.

The first light transmissive material 60 provided in step (d) can be resin or glass. The first light transmissive material 60 can be heated to a molten state beforehand, and then injected into the communicated first and second receiving spaces 1001, 1002 to cover the metal wires 40, the light wavelength converting material 50 and the electrode portion 22. As such, the first light transmissive material 60 is capable of protecting the metal wires 40, the light wavelength converting material 50 and the electrode portion 22 from outer environment without shading light from the LED die 30.

In step (e), the substrate 20 including the die supporting portion 21 and the electrode portion 22 is separated from the bottom plate 11 including the first portion 110 and the second portion 112. Accordingly, an LED package is fabricated.

Due to that the above packaging method avoids employing compression molding process in making the encapsulation, the bonds of the metal wires and the LED die will not be destroyed due to a possible too high compressing pressure when injecting the encapsulation.

Referring to FIG. 12, an LED packaging method according to a second embodiment includes:

step (a). providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space, fixing the die supporting portion and electrode portion respectively to bottoms of the first and second receiving spaces by solder;

step (b). disposing an LED die on the die supporting portion of the substrate and electrically connecting the LED die to the electrode portion of the substrate by metal wires;

step (c). injecting a light wavelength converting material into the first receiving space and covering the LED die with the light wavelength converting material;

step (d). communicating the first receiving space to the second receiving space, injecting a first light transmissive material into the communicated first and second spaces, and covering the light wavelength converting material and the metal wires with the first light transmissive material; and step (e). heating the solder and removing the mold when the solder melts.

The step (a) according to the second embodiment can be performed as follows: providing a mold with first and second receiving spaces isolated from each other and a substrate with a die supporting portion and an electrode portion isolated from each other; coating a solder on bottoms of the first and second receiving spaces; disposing the die supporting portion of the substrate on the bottom of the first receiving space and the electrode portion of the substrate on the bottom of the second receiving space; heating the solder to fix the die supporting portion and the electrode portion to the mold.

The step (e) according to the second embodiment can performed as follows: heating the bottoms of the first and second receiving space, removing the mold from the die supporting portion and the electrode portion of the substrate when the solder melts.

It is to be said that, the solder can be a low melting point solder. As such, the solder can be heated to melt at a relatively low temperature. The bottoms of the first and second receiving space are top surfaces of the first portion 110 and the second portion 112 of the bottom plate 11, in this embodiment.

Figure 13B:
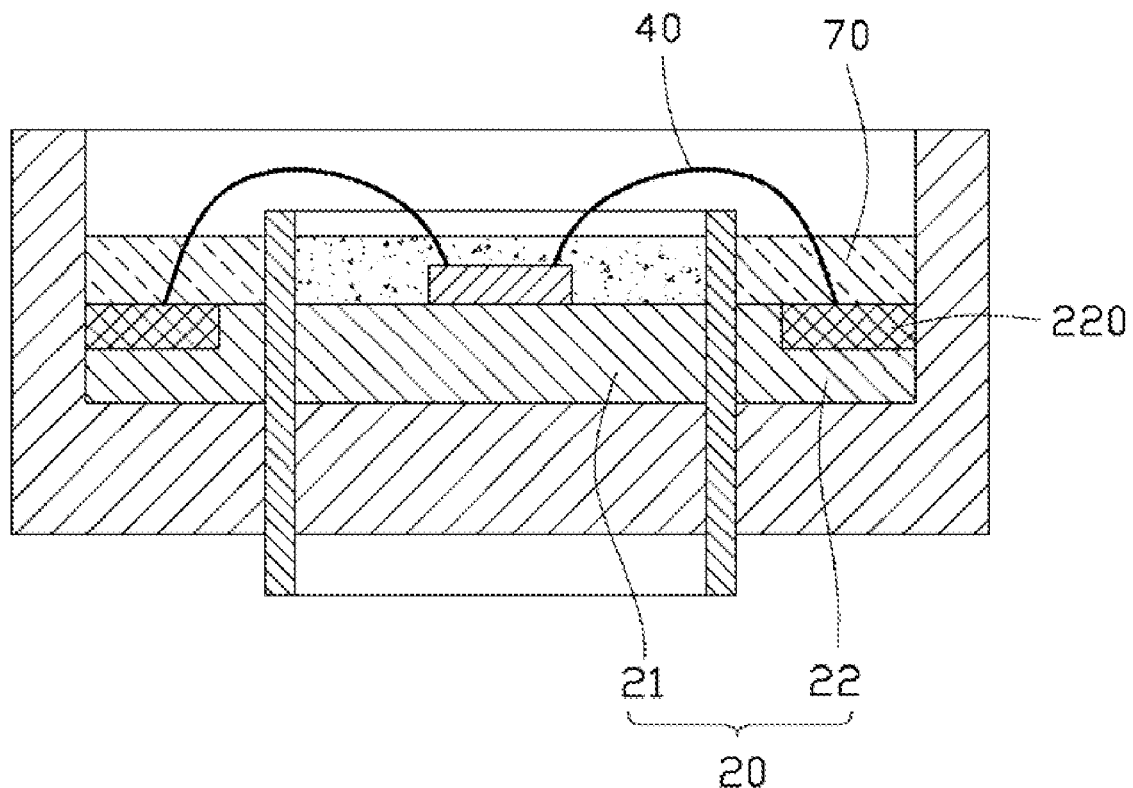
FIGS. 13B-13E are schematic views of different steps of the LED packaging method in FIG. 13A.
Figure 13C:
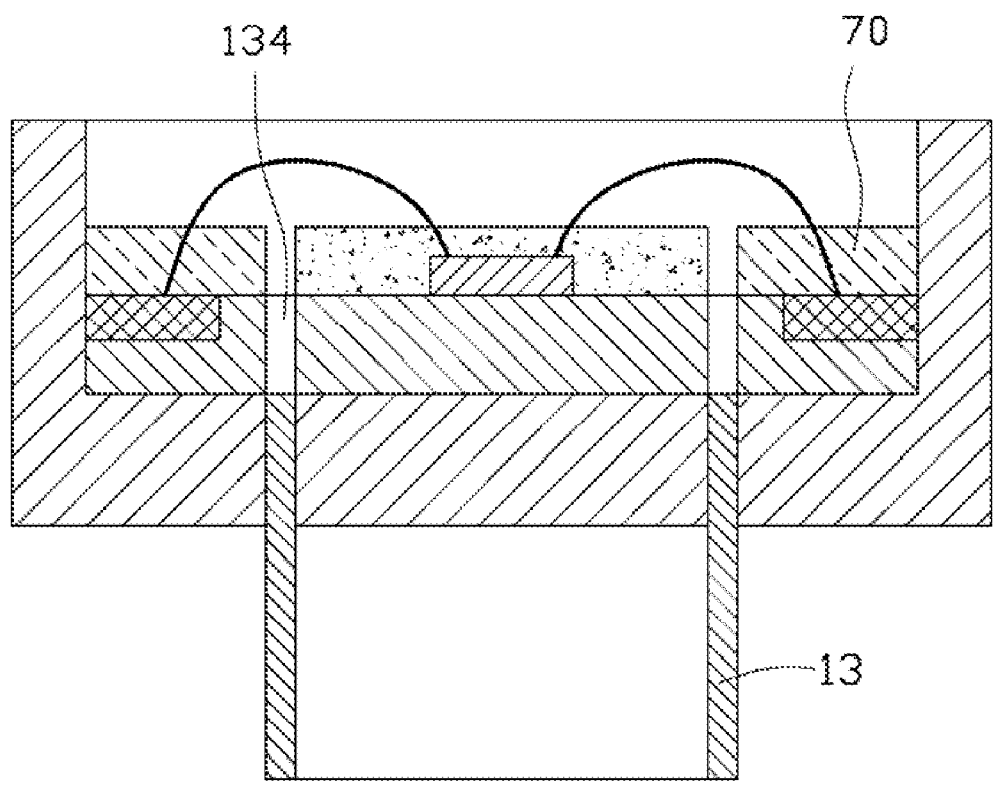
Figure 13D:
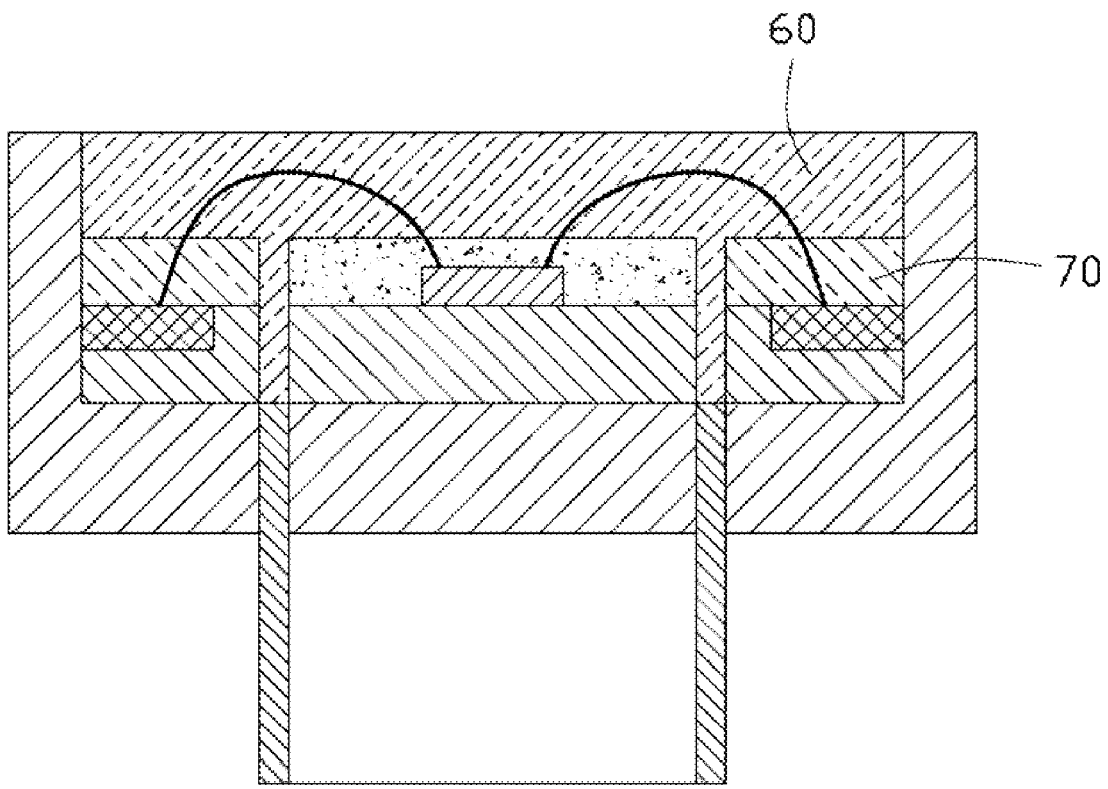
Figure 13E:
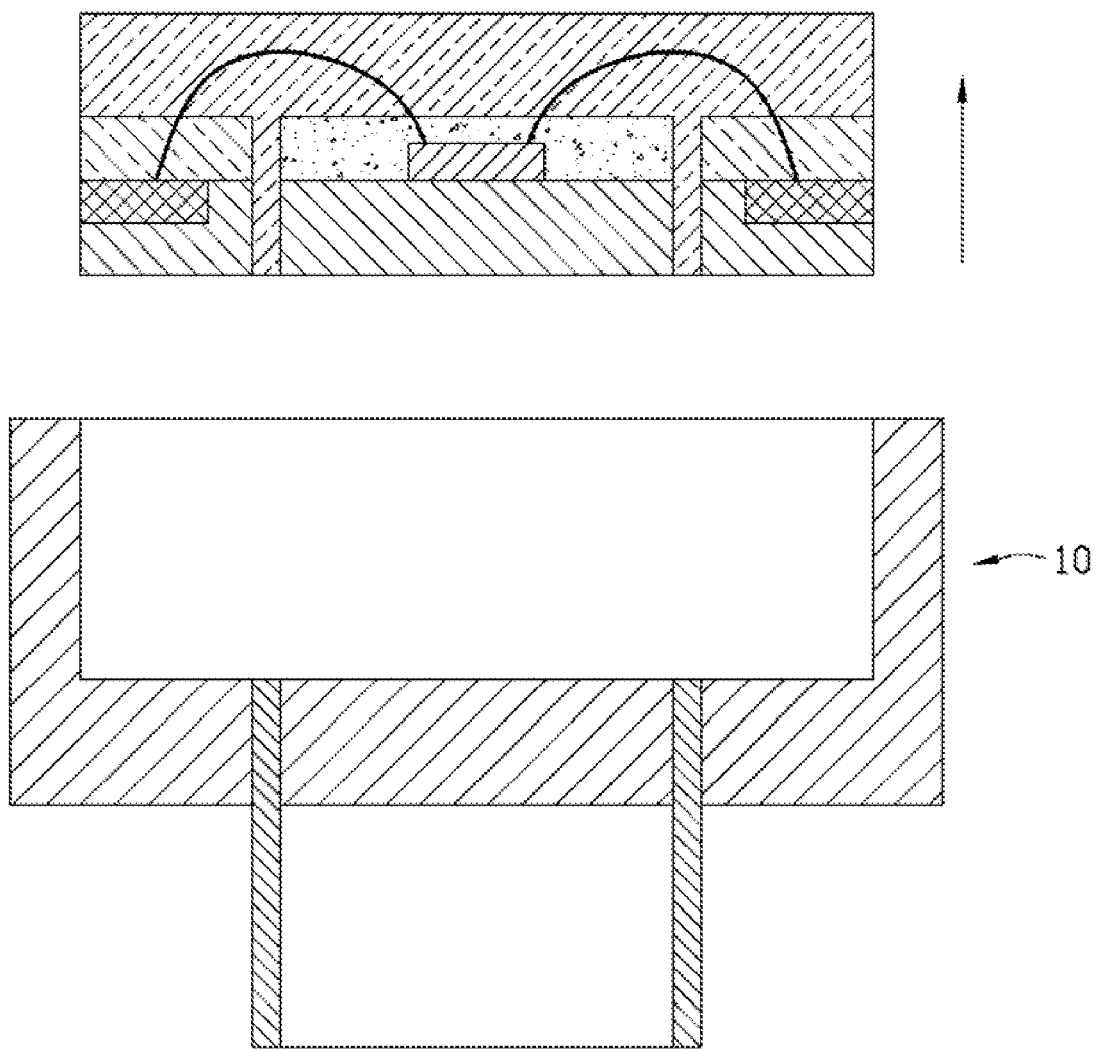

Referring to FIG. 13A, an LED packaging method according to a third embodiment includes:

step (a). providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space;

step (b). disposing an LED die on the die supporting portion of the substrate and electrically connecting the LED die to the electrode portion of the substrate by metal wires;

step (c). injecting a light wavelength converting material into the first receiving space and covering the LED die with the light wavelength converting material;

step (d). injecting a second light transmissive material into the second receiving space and covering the electrode portion of the substrate with the second light transmissive material;

step (e). communicating the first receiving space to the second receiving space, injecting a first light transmissive material into the communicated first and second space, and covering the light wavelength converting material, the second light transmissive material and the metal wires with the first light transmissive material; and step (f). removing the mold.

FIGS. 13B-13E show the schematic views of different steps of the LED packaging method according to the third embodiment. The second light transmissive material 70 covers the electrodes 220 of the electrode portion 22 and the metal wires 40, thereby enhancing bonding strength therebetween.

Referring to FIG. 14, an LED packaging method according to a fourth embodiment includes steps:

step (a). providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space, fixing the die supporting portion and electrode portion respectively to bottoms of the first and second receiving spaces by solder;

step (b). disposing an LED die on the die supporting portion of the substrate and electrically connecting the LED die to the electrode portion of the substrate by metal wires;

step (c). injecting a light wavelength converting material into the first receiving space and covering the LED die with the light wavelength converting material;

step (d). injecting a second light transmissive material into the second receiving space and covering the electrode portion of the substrate with the second light transmissive material;

step (e). communicating the first receiving space to the second receiving space, injecting a first light transmissive material into the communicated first and second space, and covering the light wavelength converting material, the second light transmissive material and the metal wire with the first light transmissive material; and step (f). heating the solder and removing the mold from the substrate when the solder melts.

Figure 15:
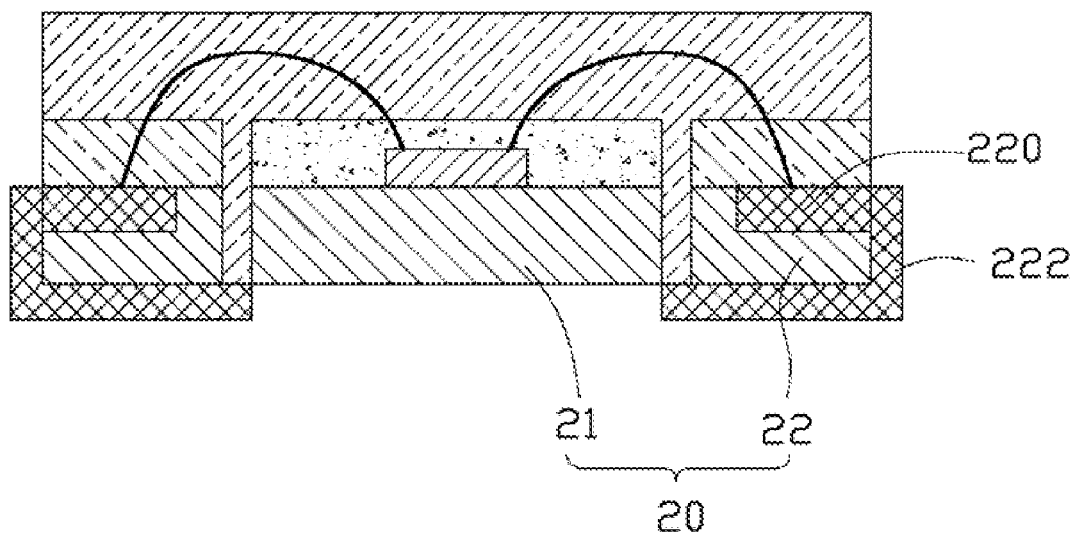
FIG. 15 is a cross-sectional view of an LED package with a surface mounting electrode structure equipped on the LED package obtained from FIG. 13E.

Furthermore, referring to FIG. 15, a pair of electrodes 222 electrically connected to the electrodes 220 can be formed on a side surface of the substrate 21 opposite to the LED die. As such, the LED package is capable of being assembled to an external device such as a printed circuit board by surface mounting technology (SMT).

Figure 16A:
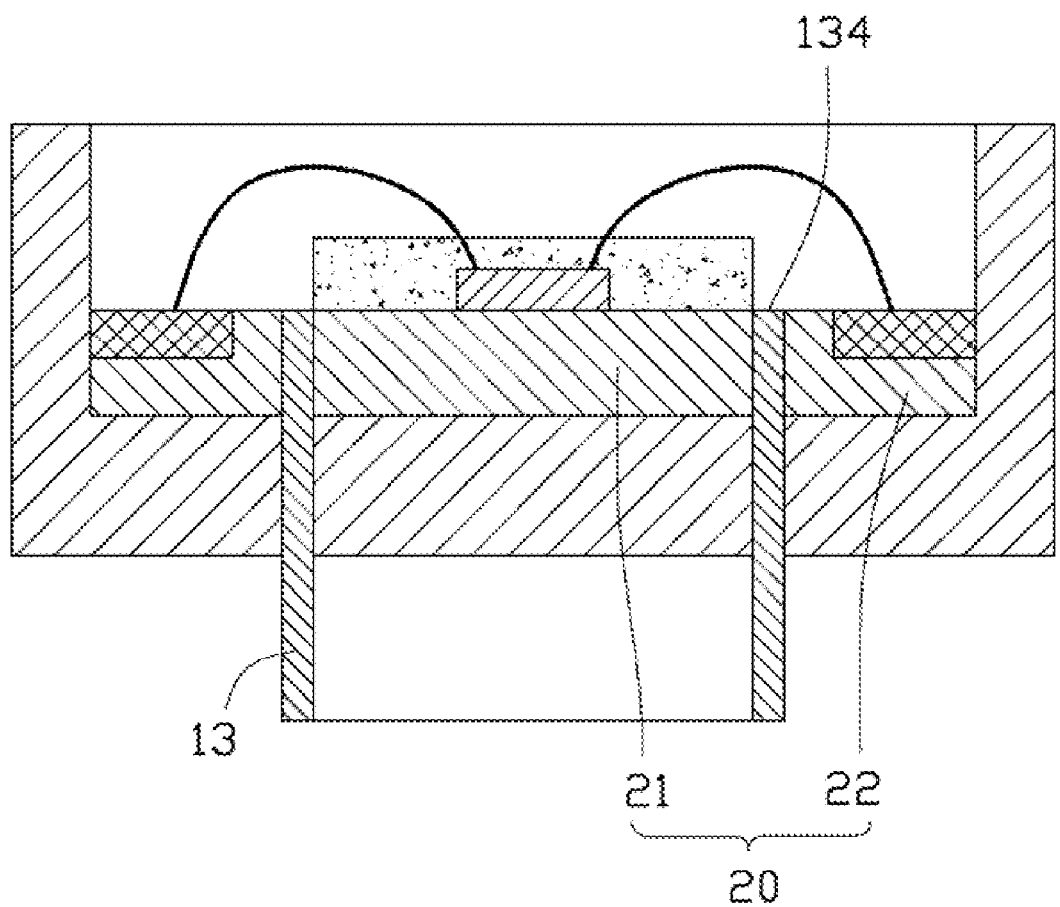
FIGS. 16A-16C are schematic views of different steps of an LED packaging method in accordance with a fifth embodiment of the present disclosure.
Figure 16B:
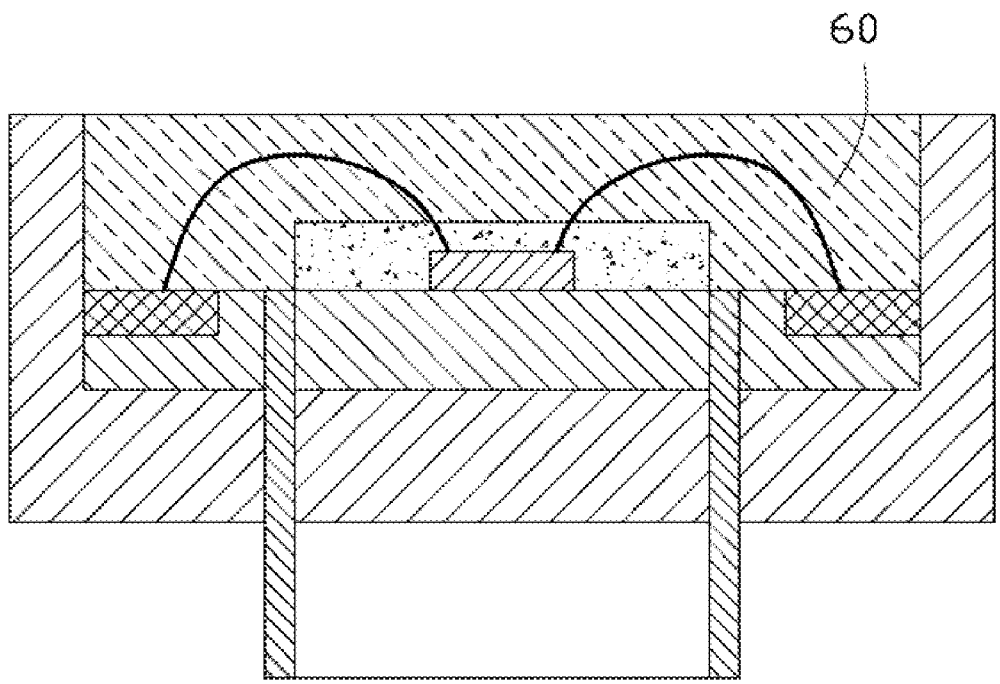
Figure 16C:
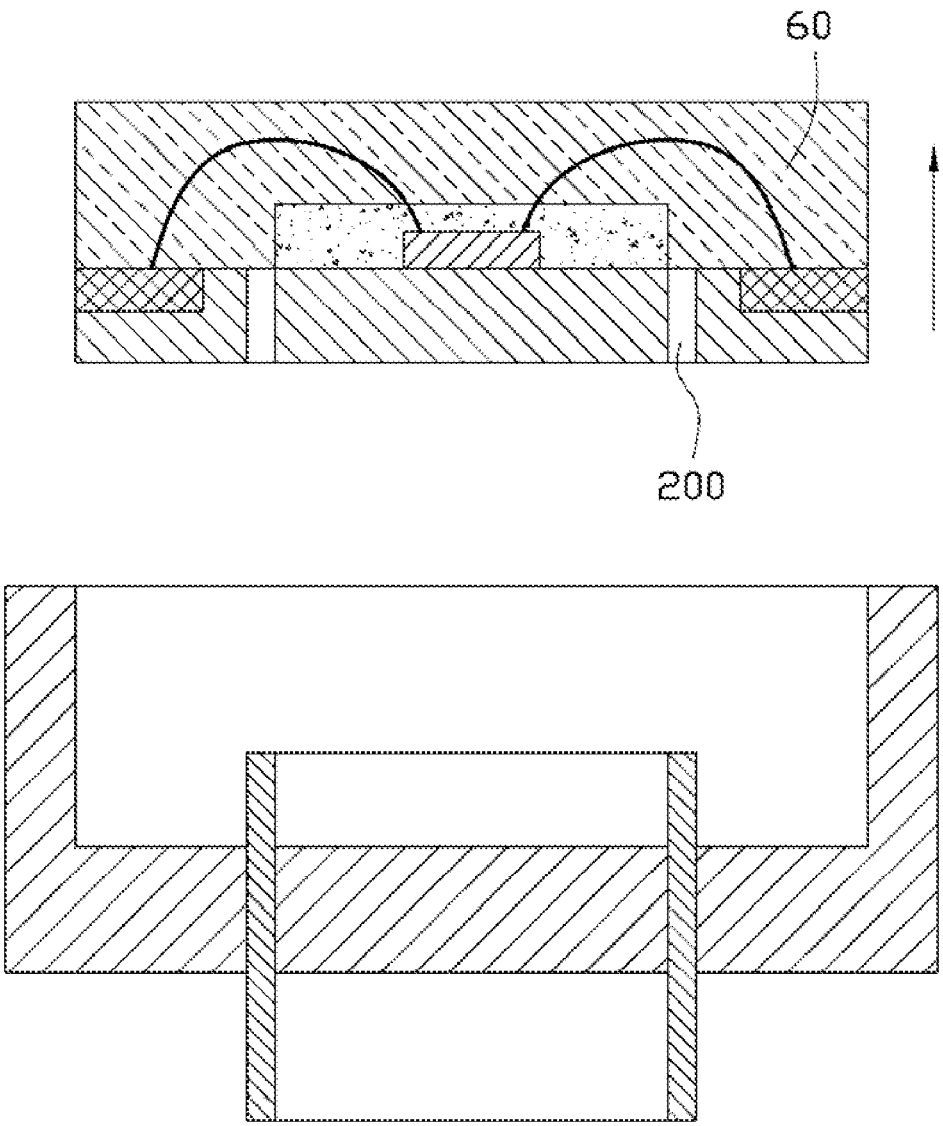
Figure 16D:
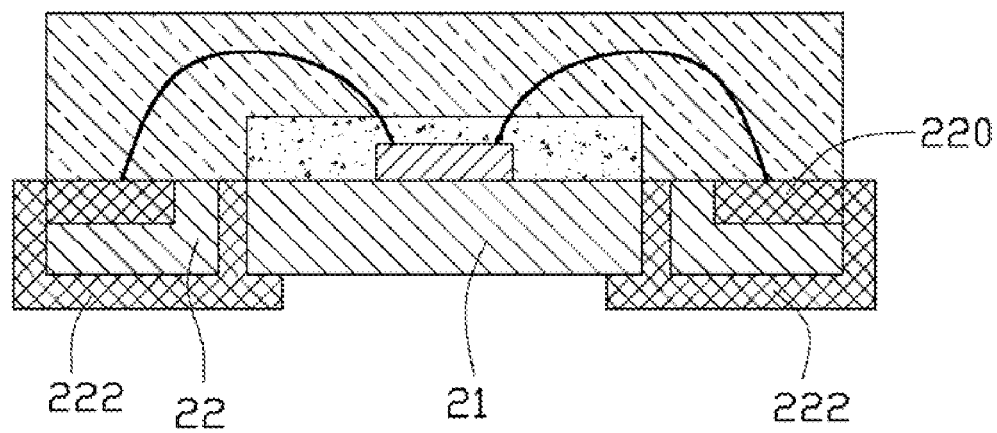
FIG. 16D is a cross-section of an LED package with a surface mounting electrode structure equipped on the LED package obtained from FIG. 16C.

Referring to FIGS. 16A-16C, when pulling the baffle plate 13 outwardly, the top portion 134 of the baffle plate 13 can be moved to a position coplanar with a top surface of the substrate 21. As such, after injecting the first light transmissive material 60 and removing the mold, the through hole 200 configured in the substrate 21 is reserved to interferentially receiving branches of the electrodes 222, thereby enhancing structural strength and reliability of the LED package.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for packaging an LED (light emitting diode) comprising:
    step (a): providing a mold and a substrate, the mold comprising a first receiving space and a second receiving space isolated from each other, the substrate comprising a die supporting portion and an electrode portion isolated from each other, the die supporting portion being received in the first receiving space, the electrode portion being received in the second receiving space;
    step (b): disposing an LED die on the die supporting portion of the substrate and electrically connecting the LED die to the electrode portion of the substrate by at least a metal wire;
    step (c): injecting a light wavelength converting material into the first receiving space and covering the LED die and bonding between the LED die and the at least a metal wire with the light wavelength converting material;
    step (d): communicating the first receiving space to the second receiving space, injecting a first light transmissive material into the communicated first and second spaces, and covering the light wavelength converting material and the at least a metal wire with the first light transmissive material; and
    step (e): removing the mold from the substrate to obtain the LED comprising the substrate, the LED die, the at least a metal wire, the light wavelength converting material and the first light transmissive material.

2. The LED packaging method according to claim 1, wherein the mold comprises a container, a first through hole at a bottom of the container and a baffle plate, the first thorough hole having a ring shape, the baffle plate being a hollow column with a ring shape, the baffle plate partly penetrating through the through hole and divides an interior space of the container into the isolated first and second receiving spaces.

3. The LED packaging method according to claim 2, wherein the electrode portion surrounds the die supporting portion and is isolated from the die supporting portion by a second through hole defined in the substrate and having a ring-shaped configuration, and the second through hole is aligned and communicates with the first through hole.

4. The LED packaging method according to claim 3, wherein the second through hole has a shape and size substantially the same as those of the first through hole.

5. The LED packaging method according to claim 1, wherein the mold comprises a chamber and a baffle plate dividing an interior space of the chamber into the first receiving space and the second receiving space.

6. The LED packaging method according to claim 5, wherein, in step (d), the first receiving space is communicated to the second receiving space by removing the baffle plate from the chamber.

7. The LED packaging method according claim 1, further comprising injecting a second light transmissive material into the second receiving space and covering the electrode portion of the substrate, after step (c) and before step (d).

8. The LED packaging method according claim 7, wherein, in step (d), the first light transmissive material also covers the second light transmissive material.

9. The LED packaging method according claim 1, wherein step (a) is performed as follows: providing a mold with first and second receiving spaces isolated from each other and a substrate with a die supporting portion and an electrode portion isolated from each other; coating a solder on bottoms of the first and second receiving spaces; disposing the die supporting portion of the substrate on the bottom of the first receiving space and the electrode portion of the substrate on the bottom of the second receiving space; heating the solder to fix the die supporting portion and the electrode portion to the mold.

10. The LED packaging method according to claim 9, wherein step (e) is performed as follows: heating the bottoms of the first and second receiving space, removing the mold from the die supporting portion and the electrode portion of the substrate when the solder is melted.

11. The LED packaging method according claim 1, further comprising: forming a pair of electrodes on a side of the substrate opposite to the first light transmissive material, said electrodes being electrically connected with the electrode portion and configured for electrically connecting with an external device by surface mounting technology.

12. The LED packaging method according to claim 11, wherein the electrodes each have a branch engaging in the substrate.

* * * * *